United States Patent
Peterson et al.

(10) Patent No.: US 9,276,594 B2
(45) Date of Patent: Mar. 1, 2016

(54) NOISE MANAGEMENT METHOD AND CIRCUIT FOR ASYNCHRONOUS SIGNALS

(71) Applicant: Cirrus Logic, Inc., Austin, TX (US)

(72) Inventors: Cory Jay Peterson, Rockford, MI (US); Bhoodev Kumar, Austin, TX (US); Daniel John Allen, Austin, TX (US); Jeffrey D. Alderson, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 186 days.

(21) Appl. No.: 13/840,345

(22) Filed: Mar. 15, 2013

(65) Prior Publication Data

US 2014/0266337 A1 Sep. 18, 2014

(51) Int. Cl.
*H03L 7/06* (2006.01)
*H03L 7/10* (2006.01)

(52) U.S. Cl.
CPC ........................................ *H03L 7/104* (2013.01)

(58) Field of Classification Search
USPC ........................................................ 327/150
See application file for complete search history.

(56) References Cited

U.S. PATENT DOCUMENTS

| 6,429,711 | B1 * | 8/2002 | Tschanz et al. | 327/211 |
| 2003/0090307 | A1 * | 5/2003 | Shin | 327/200 |
| 2010/0207677 | A1 * | 8/2010 | Trivedi et al. | 327/199 |

* cited by examiner

*Primary Examiner* — Lincoln Donovan
*Assistant Examiner* — Patrick Chen
(74) *Attorney, Agent, or Firm* — Norton Rose Fulbright US LLP (57) ABSTRACT

Noise may be reduced by delaying signal propagation outside of a time window when a change in another signal is expected. A time window may be defined between the change of the first clock signal and the change of the second clock signal during which a third signal, such as a data signal, does not propagate through the circuit. When a change occurs in a third signal after the first clock signal change while the first clock signal is at a different level than a second clock signal, propagation of the third signal change may be delayed until a change in the second clock signal is received. Delayed propagation may be achieved through a latch and hold circuit with no metastability.

20 Claims, 6 Drawing Sheets

NOISE MANAGEMENT METHOD AND CIRCUIT FOR ASYNCHRONOUS SIGNALS

FIELD OF THE DISCLOSURE

The instant disclosure relates to circuits. More specifically, this disclosure relates to noise management in circuits.

BACKGROUND

Switching noise can affect the operation of a circuit, whether the circuit is an analog circuit, a digital circuit, or a mixed signal circuit. When transistors of a circuit switch from a conducting state to a non-conducting state, or from a non-conducting state to a conducting state, noise is generated in the circuit. The switching noise occurs when output from a power supply to the circuit varies based on changing power demands within the circuit. Switching noise is made worse by increasing the number of transistors switching simultaneously. Because many circuits have clock signals that synchronize operation of transistors across the circuit, switching noise may be worst around transitions in the clock signal, when transistors within the circuit switch from conducting to non-conducting or vice versa.

Switching noise can affect circuits constructed on a common substrate, because signals in the circuit are coupled to the substrate through the transistors that are constructed on the substrate. In a mixed signal system, analog and digital circuits may be built on a common substrate. Switching noise in the digital circuits of the mixed signal system may affect sampling of analog values in the analog circuits of the mixed signal system.

One conventional solution is to synchronize clock signals between a data clock and an internal clock used by the analog and digital circuits to reduce noise effects on analog data sampling. However, the synchronization results in a hard delay of at least a half cycle or one cycle of the internal clock. As a result of the hard delay, the performance of the circuit may suffer. Further, the additional circuitry for synchronizing the clock signals consumes die area on a substrate and consumes power, which further degrades performance of the circuit.

SUMMARY

Noise may be reduced by delaying signal propagation outside of a time window when a change in a signal is expected. Changes in the clock signal may generate noise in the circuit due to, for example, current consumed by transistors driven by the clock signal. That is, the change in the clock signal may switch on and off transistors throughout the circuit, which may result in significant noise. A time window may be defined between the change of a first clock signal and the change of a second clock signal. During the window, a third signal, such as a data signal, is not allowed to propagate through the circuit.

According to one embodiment, a method includes receiving a change in a first clock signal. The method also includes receiving a change in an input signal after the first clock signal change while the first clock signal is at a different level than a second clock signal. The first clock signal and the second clock signal are asynchronous to the input signal, and the second clock signal is a delayed version of the first clock signal. The method further includes delaying propagation of the input signal change until a change in the second clock signal is received.

In certain embodiments, the method may also include latching, when the first clock signal changes, the third signal from an input line; holding the latched third signal at an output line; receiving the change in the second clock signal; and propagating the third signal change to the output line after receiving the second clock signal change. The method may also include passing signals from the input line to the output line after the change in the second clock signal, while the first clock signal is at a similar level as the second clock signal.

According to another embodiment, an apparatus includes a first clock signal input configured to receive a first clock signal. The apparatus also includes a second clock signal input configured to receive a second clock signal, in which the second clock signal is delayed from the first clock signal. The apparatus further includes a third signal input configured to receive a third signal, in which the third signal is asynchronous from the first and second clock signals. The apparatus also includes a digital logic circuit coupled to the first clock signal input, to the second clock signal input, and to the third signal input. The digital logic circuit is configured to receive a change in the first clock signal. The digital logic circuit is also configured to receive a change in the third signal after receiving the change in the first clock signal and while the first clock signal is at a different level than the second clock signal. The digital logic circuit is further configured to delay propagation of the third signal change until a change in the second clock signal is received.

In certain embodiments, the digital logic circuit may also be configured to latch, when the first clock signal changes, the third signal input; to hold the latched third signal input at the signal output; to receive the change in the second clock signal; and to propagate the third signal change to the signal output after receiving the second clock signal change. In some embodiments, the latch may include a logic gate coupled to the first clock signal input and to the second clock signal input; a tri-state buffer coupled to the third signal input and to the logic gate; and a Schmitt trigger coupled to the tri-state buffer and to the signal output. The latch may be configured to pass signals from the third signal input to the signal output after the change in the second clock signal is received.

According to yet another embodiment, an apparatus includes a first clock signal input for receiving a first clock signal. The apparatus also includes a second clock signal input for receiving a second clock signal, wherein the second clock signal is delayed from the first clock signal. The apparatus further includes a data signal input for receiving a third signal, wherein the third signal is asynchronous from the first and second clock signals. The apparatus also includes means for delaying propagation of a change in the third signal, received after a change in the first clock signal and before a change in the second clock signal, until after the change in the second clock signal.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Noise may be reduced by delaying signal propagation outside of a time window when a change in another signal is expected. For example, when two clock signals are present in a circuit, a second clock signal may be a delayed version of a first clock signal. With this clock signal arrangement, after the first clock signal changes the second clock signal is expected to change shortly thereafter. Changes in the clock signal may generate noise in the circuit due to, for example, current consumed by transistors driven by the clock signal. That is, the change in the clock signal may switch on and off transistors throughout the circuit, which may result in significant noise. A time window may be defined between the change of the first clock signal and the change of the second clock signal during which a third signal, such as a data signal, is not allowed to propagate through the circuit. After the second clock signal changes, changes in the third signal may be allowed to propagate through the circuit.

Figure 1:
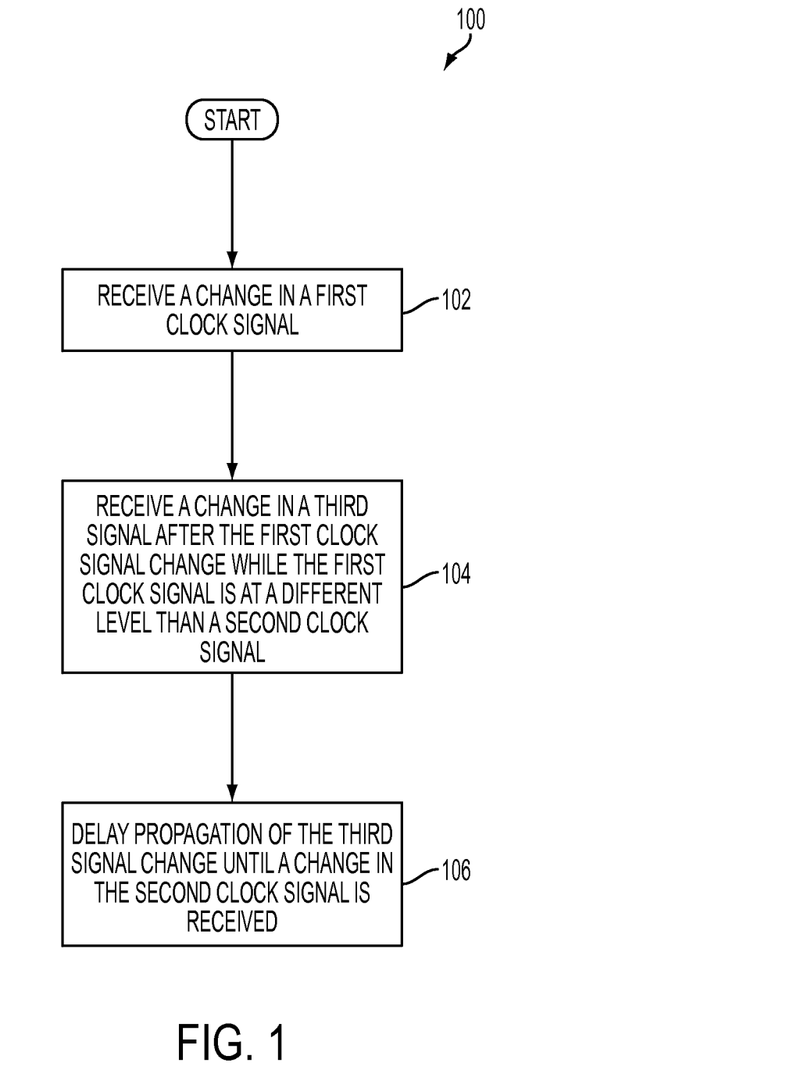
FIG. 1 is a flow chart illustrating a method of reducing noise in a circuit according to one embodiment of the disclosure.

FIG. 1 is a flow chart illustrating a method of reducing noise in a circuit according to one embodiment of the disclosure. A method 100 begins at block 102 with receiving a change in a first clock signal. At block 104, a change in a third signal is received after the first clock signal change while the first clock signal is at a different level than a second clock signal. At block 106, propagation of the change in the third signal is delayed until the second clock signal change is received.

Figure 2:
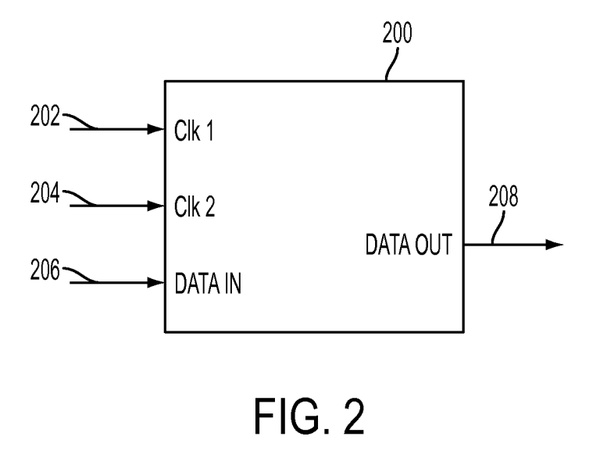
FIG. 2 is a block diagram illustrating a circuit for reducing noise in a circuit according to one embodiment of the disclosure.

FIG. 2 is a block diagram illustrating a circuit for reducing noise in a circuit according to one embodiment of the disclosure. A digital logic circuit 200 for carrying out the method 100 of FIG. 1 may be packaged as an integrated circuit in, for example, flip-chip packaging. According to one embodiment, the digital logic circuit 200 may be part of a mixed signal system containing analog and digital signals.

The digital logic circuit includes an input 202 for a first clock signal, an input 204 for a second clock signal, an input 206 for a third signal, and an output 208 for an output signal. The third signal may be, for example, a data signal, such as a digital representation of an audio signal, or a third clock signal. The third signal may be asynchronous to the first and second clock signals. According to one embodiment, the input 202 for the first clock signal may be a global clock signal received by the integrated circuit, and the input 204 for the second clock signal may be a delayed clock signal generated within the integrated circuit.

The output signal 208 may convey similar information as the third signal 206. That is, the third signal 206 may pass through the digital logic circuit 200 to the output signal 208. However, when a change in the first clock signal results in the first clock signal being at a different level than the second clock signal, the digital logic circuit 200 may hold the output of the third signal 206 at the time of the first clock signal change at the output signal 208. That is, propagation of a change in the third signal 206 may not pass through the digital logic circuit 200 to the output signal 208 during a time window defined by a start time when a change in the first clock signal is received to an end time when a change in the second clock signal is received. In one embodiment, the output signal 208 may drive the third signal change to a pin, such as a serial audio port, of an integrated circuit.

Figure 3:
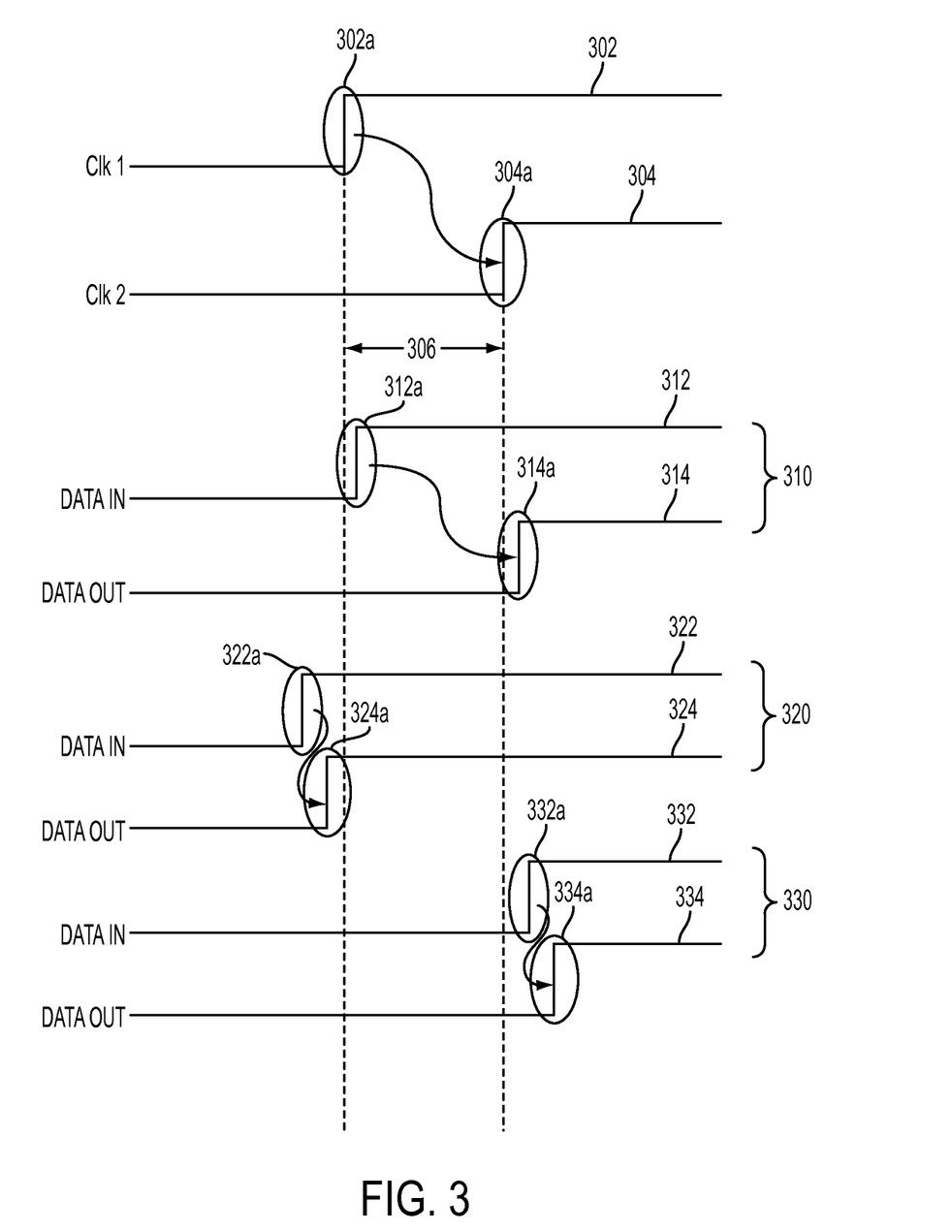
FIG. 3 is a timing diagram illustrating operation of the method of reducing noise on sample signals according to one embodiment of the disclosure.

Operation of the circuit of FIG. 2 and the method of FIG. 1 is further explained with reference to timing diagrams. FIG. 3 is a timing diagram illustrating operation of the method of reducing noise on sample signals according to one embodiment of the disclosure. A second clock signal 304 may be a delayed version of a first clock signal 302. A change 302a in the first clock signal 302 is followed by a change 304a in the second clock signal 304. In one situation 310, a change 312a in a third signal 312, such as a data input signal, may occur during a window 306 between the change 302a and the change 304a. Because the change 302a occurs during the window 306, the change 302a is not propagated to a change 314a of an output signal 314, such as a data output signal, until after the window 306. That is, when the change 312a on a third signal occurs after the first clock signal change 302a and before the second clock signal change 304a, the propagation of the change 312a to the change 314a is delayed until after the second clock signal change 304a.

Although rising clock cycles are illustrated in the timing diagrams of FIG. 3, the propagation delay may also be applied on the falling clock cycles. For example, at a later time the first clock signal 302 may transition to a low state. If a change in the third signal occurs after the first clock signal falls but before the second clock signal falls, propagation of the change in the third signal to the output signal may be delayed until the second clock signal falls.

In other situations, the digital logic circuit 200 may pass through changes in the third signal to the output signal. That is, the digital logic circuit 200 may operate transparently outside of the window 306. For example, in situation 320 a change 322a of a third signal 322 occurs before the first clock signal change 302a. Thus, the change 322a is immediately propagated to a change 324a on the output signal 324. Although no delay is intentionally added to the change 322a, intrinsic delay in reproducing the change 322a on the output signal 324 may result from transmission line lengths within the digital logic circuit 200.

In another example, in situation 330, a change 332a of a third signal 332 occurs after the first clock signal change 302a and after the second clock signal change 304a. Thus, the change 332a is immediately propagated to a change 334a on the output signal 334. As with situation 320, some intrinsic delay may exist. However, no delay above the intrinsic delay is added when propagating the change 332a to the change

334*a*. Changes are propagated without additional delay in both situations 320 and 330 because the changes 322*a* and 332*a* occur outside of the window 306.

Figure 4:
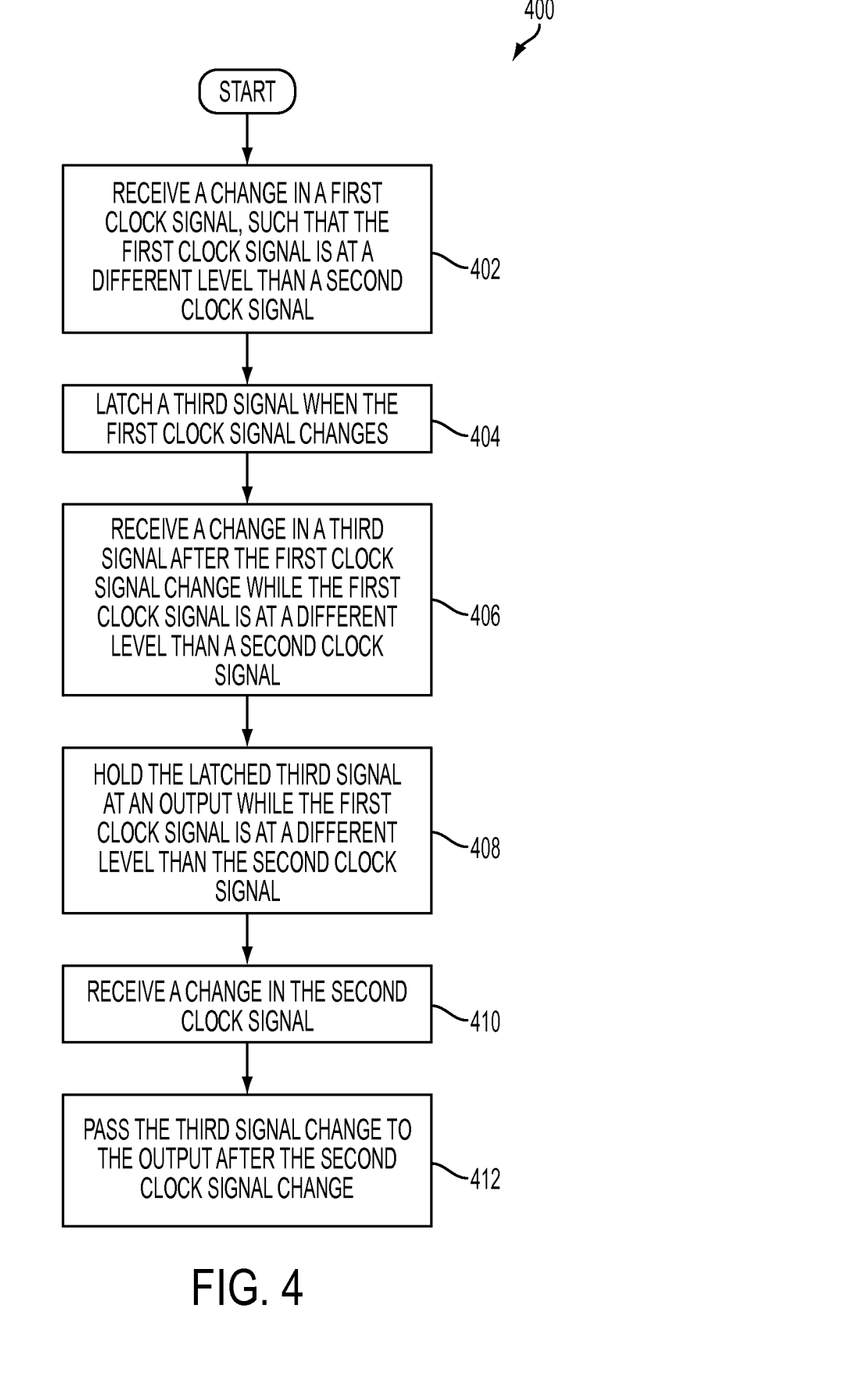
FIG. 4 is a flow chart illustrating a method of reducing noise in a circuit by latching and holding a signal according to one embodiment of the disclosure.

One method for implementing the delayed propagation of the change may include latching and holding a third signal at the start time of the window 306. At the end time of the window 306, the latch is released and any change in the third signal may be allowed to propagate to the output signal. FIG. 4 is a flow chart illustrating a method of reducing noise in a circuit by latching and holding a signal according to one embodiment of the disclosure.

A method 400 begins at block 402 with receiving a change in a first clock signal, such that the first clock signal is at a different level than a second clock signal. When the second clock signal is a delayed version of the first clock signal, a change in the second clock signal may be expected after the change in the first clock signal. At block 404, a third signal, such as a data signal or a third clock signal, may be latched when the first clock signal change is received at block 402. At block 406, a change in the third signal may be received after the first clock signal change is received and while the first clock signal is at a different level than the second clock signal. At block 408, the latched third signal value is held at the output signal while the first clock signal is at a different level than the second clock signal. That is, the third signal change received at block 406 is not propagated to the output signal. At block 410, a change in the second clock signal may be received, which results in the second clock signal being at the same level as the first clock signal. At block 412, the change in the third signal received at block 406 may be allowed to pass to the output signal after the second clock signal changes at block 410.

Figure 5:
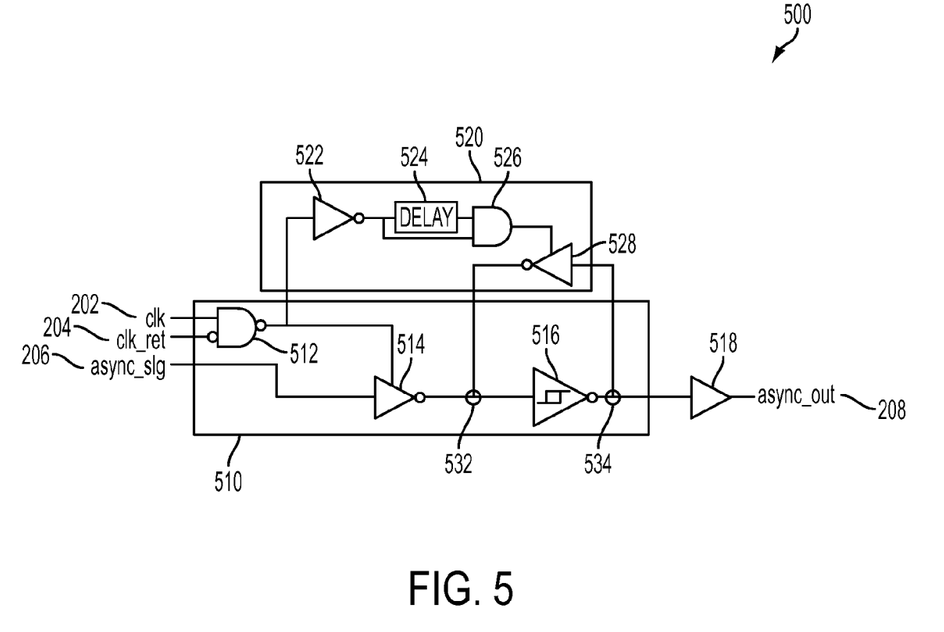
FIG. 5 is a block diagram illustrating a circuit for reducing noise in a circuit by latching and holding a signal according to one embodiment of the disclosure.

A digital logic circuit for implementing the latch and hold method of FIG. 4 is illustrated in FIG. 5. FIG. 5 is a block diagram illustrating a circuit for reducing noise in a circuit by latching and holding a signal according to one embodiment of the disclosure. A digital logic circuit 500 may be packaged as part of an integrated circuit, such as illustrated in FIG. 2. The digital logic circuit 500 may include inputs for a first clock signal 202, a second clock signal 204, and a third signal 206, such as an asynchronous data signal. The third signal 206 may be asynchronous from the first and second clock signals. The first clock signal may be a delayed version of the second clock signal. The circuit 500 may also include an output for an output signal 208.

The circuit 500 may include a latch portion 510 and a feedback portion 520. The latch portion 510 may include a logic gate 512, a tri-state buffer 514, and a Schmitt trigger 516. The logic gate 512 may be coupled to the first clock signal input 202 and the second clock signal input 204. According to one embodiment, the logic gate 512 may be a NAND gate with a NOT gate added to either the first clock signal input 202 or the second clock signal input 204. When the first clock signal input 202 is high and the second clock signal input 204 is low, the logic gate 512 may output a low value. Although a rising edge detection circuit is shown, a falling edge detection circuit may be substituted for the rising edge detection circuit. According to another embodiment, the logic gate 512 may be a half XOR gate for detecting one edge of the clock signal inputs 202 and 204 or the logic gate 512 may be a full XOR gate for detecting both edges of the clock signal inputs 202 and 204.

The logic gate 512 may be coupled to an enable input of the tri-state buffer 514. When the rising edges of the first clock signal input 202 and the second clock signal input 204 are detected, the output of the logic gate 512 may enable the tri-state buffer 514 to pass signals from the third signal input 206 to the Schmitt trigger 516. When the first clock signal input 202 and the second clock signal input 204 are at different levels, the output of the logic gate 512 may disable the tri-state buffer 514 to disconnect the third signal input 206 from the Schmitt trigger 516.

The Schmitt trigger 516 may be coupled to the tri-state buffer 514 for receiving the third signal input 206. The Schmitt trigger 516 may also be coupled to a buffer 518 for outputting a signal to the output signal 208, such as a pin of an integrated circuit for a serial audio port. The Schmitt trigger 516 may hold a previous value of the third signal input 206 when the tri-state buffer 514 is disabled.

The tri-state buffer 514 may be disabled during a window during which changes in the third signal input 206 are not propagated to the output signal 208. When the tri-state buffer 514 is disabled, there is no driver for a node 532. The feedback circuit 520 may hold a value at node 532 similar to the value that was present before the tri-state buffer 514 was disabled by the logic gate 512. The Schmitt trigger 516 displays hysteresis behavior for producing an output at node 534. The hysteresis behavior results in the production of only two values by the Schmitt trigger 516 at the node 534. That is, minor variations in the value at the node 532 will not alter the output at node 534. Instead, the output of the Schmitt trigger 516 at the node 534 may not change until a large change in the value at node 532 occurs. A large change to cause switching of the output of the Schmitt trigger 516 at node 534 may not occur until the tri-state buffer 514 is re-enabled and outputs a changed value to the node 532.

The feedback portion 520 may include a buffer 522 coupled to receive the output of the logic gate 512. The output of the logic gate 512 may be provided to a delay circuit 524 through the buffer 522. The output of the delay circuit 524 may be provided to a logic gate 526, such as an AND gate, along with the undelayed version of the logic gate 512 output. The output of the logic gate 526 may be coupled to an enable input of a tri-state buffer 528. The tri-state buffer 528 may be coupled to receive an input from the node 534, the output of the Schmitt trigger 516. The tri-state buffer 528 drives the node 532 with the output value of the Schmitt trigger 516, when the tri-state buffer 528 is enabled.

The tri-state buffer 528 may be enabled when the tri-state buffer 514 is disabled. That is, when the tri-state buffer 514 does not drive the node 532 with the third signal input 206, the tri-state buffer 528 drives the node 532 with the output of the Schmitt trigger 516. The delay circuit 524 may be configured to provide a short delay between the disabling of the tri-state buffer 514 and enabling of the tri-state buffer 528. The delay circuit 524 may include one or more buffers and delay enabling of the tri-state buffer 528 to prevent contention at the node 532.

The combination of the feedback portion 520 and the Schmitt trigger 516 prevents metastability of the latch 510. Further, the combination of the feedback portion 520 and the Schmitt trigger 516 prevents glitches from occurring at the output signal 208. That is, a single change on the third signal 206 propagates only a single change on the output signal 208, and the change of the output signal 208 occurs with a predictable delay relative to the first clock signal 202 and the second clock signal 204. A glitch may otherwise occur at the output signal 208 resulting in multiple changes on the output signal 208, when the third signal changes near the change of the first clock signal. Further, the feedback portion 520 and the Schmitt trigger 516 may prevent the output signal 208 from changing during a window defined by a change in the first clock signal and a corresponding change in the second clock signal.

Figure 6:
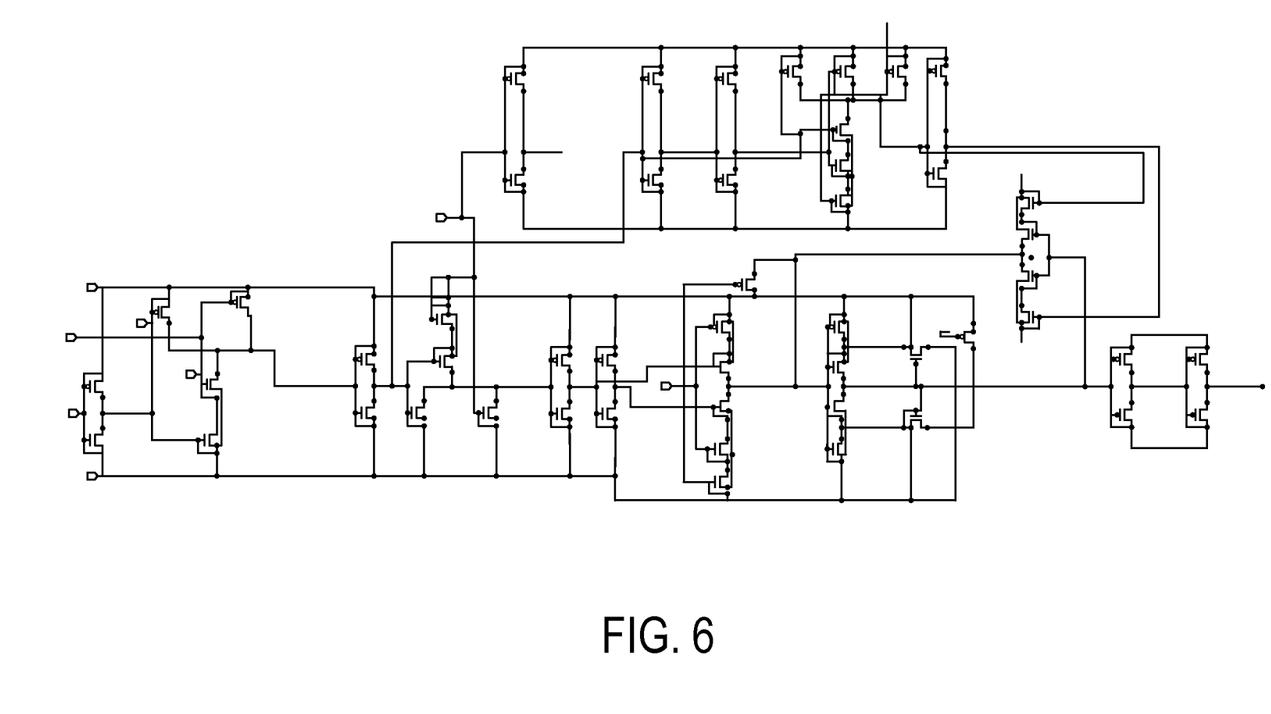
FIG. 6 is a complimentary metal-oxide semiconductor (CMOS) circuit arrangement for the circuit of FIG. 5 according to one embodiment of the disclosure.

The circuit illustrated in FIG. 5 may be constructed in an integrated circuit as a complimentary metal-oxide semiconductor (CMOS) circuit. FIG. 6 is a complimentary metal-oxide semiconductor (CMOS) circuit arrangement for the circuit of FIG. 5 according to one embodiment of the disclosure.

If implemented in firmware and/or software, the functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:
receiving a change in a first clock signal;
receiving a change in an input signal;
when the input signal change is received after a first clock signal change and before a corresponding change is received at a second clock signal, wherein the first clock signal and the second clock signal are asynchronous to the input signal, and wherein the second clock signal is a delayed version of the first clock signal, delaying propagation of the input signal change until the corresponding change in the second clock signal is received; and
when the input signal change is received after the corresponding change is received at the second clock signal and before receiving another change in the first clock signal, propagating the input signal change without additional delay.

2. The method of claim 1, in which the step of delaying propagation of the input signal change comprises propagating only one change of the input signal with a predictable delay.

3. The method of claim 1, further comprising:
latching, when the first clock signal changes, the input signal from an input line;
holding the latched input signal at an output line;
receiving the corresponding change in the second clock signal; and
propagating the input signal change to the output line after receiving the corresponding second clock signal change.

4. The method of claim 3, further comprising passing signals from the input line to the output line after the corresponding change in the second clock signal.

5. The method of claim 1, in which the input signal is a third clock signal, different from the first and second clock signals and asynchronous with the first and second clock signals.

6. The method of claim 1, in which the input signal is a non-clock data signal asynchronous with the first and second clock signals.

7. The method of claim 6, in which the non-clock data signal comprises a digital representation of an audio signal, the method further comprising driving a pin of an integrated circuit with the input signal change after delaying propagation of the input signal change.

8. An apparatus, comprising:
a first clock signal input configured to receive a first clock signal;
a second clock signal input configured to receive a second clock signal, in which the second clock signal is delayed from the first clock signal;
a third signal input configured to receive a third signal, in which the third signal is asynchronous from the first and second clock signals; and
a digital logic circuit coupled to the first clock signal input, to the second clock signal input, and to the third signal input, in which the digital logic circuit is configured to:
receive a change in the first clock signal;
receive a change in the third signal;
when the third signal change is received after receiving the change in the first clock signal and before a corresponding change is received at the second clock signal, delay propagation of the third signal change until the corresponding change in the second clock signal is received; and
when the third signal change is received after the corresponding change is received at the second clock signal and before receiving another change in the first clock signal, propagate the third signal change without additional delay.

9. The apparatus of claim 8, wherein the third signal is a third clock signal, different from the first and second clock signals and asynchronous with the first and second clock signals.

10. The apparatus of claim 8, wherein the third signal is a non-clock data signal asynchronous with the first and second clock signals.

11. The apparatus of claim 10, wherein the third signal comprises a digital representation of an audio signal, the digital logic circuit further configured to drive a pin of an integrated circuit with the third signal change after delaying propagation of the third signal change.

12. The apparatus of claim 8, further comprising a signal output, wherein the digital logic circuit comprises a latch coupled to the third signal input and the signal output, wherein the latch is configured to:
  latch, when the first clock signal changes, the third signal input;
  hold the latched third signal input at the signal output;
  receive the corresponding change in the second clock signal; and
  propagate the third signal change to the signal output after receiving the corresponding second clock signal change.

13. The apparatus of claim 12, in which the latch comprises:
  a logic gate coupled to the first clock signal input and to the second clock signal input;
  a tri-state buffer coupled to the third signal input and to the logic gate; and
  a Schmitt trigger coupled to the tri-state buffer and to the signal output.

14. The apparatus of claim 13, wherein the tri-state buffer is configured to disable when the first clock signal changes and to remain disabled until the corresponding second clock signal change.

15. The apparatus of claim 14, wherein the Schmitt trigger is configured to retain an output of the tri-state buffer when the tri-state buffer is disabled.

16. The apparatus of claim 12, wherein the latch is configured to pass signals from the third signal input to the signal output after the corresponding change in the second clock signal is received.

17. An apparatus, comprising:
  a first clock signal input configured to receive a first clock signal;
  a second clock signal input configured to receive a second clock signal, wherein the second clock signal is delayed from the first clock signal;
  a third signal input configured to receive a third signal, wherein the third signal is asynchronous from the first and second clock signals; and
  means for delaying propagation of a change in the third signal, wherein the delaying propagation means is configured to:
    delay propagation of the change in the third signal until after a corresponding change in the second clock signal when the third signal change is received after a change in the first clock signal and before the corresponding change in the second clock signal; and
    propagate the change in the third signal without additional delay when the change is received after the corresponding change is received at the second clock signal and before receiving another change in the first clock signal.

18. The apparatus of claim 17, further comprising a signal output, wherein the propagation delay means comprises means for latching the third signal input onto the signal output.

19. The apparatus of claim 18, wherein the latching means is configured to propagate only one third signal change onto the signal output, the one signal output change corresponding to the change in the third signal.

20. The apparatus of claim 17, wherein the apparatus is integrated into a mixed signal system.

* * * * *